United States Patent
Dictus et al.

(10) Patent No.: US 9,142,456 B2
(45) Date of Patent: Sep. 22, 2015

(54) METHOD FOR CAPPING COPPER INTERCONNECT LINES

(71) Applicant: Lam Research Corporation, Fremont, CA (US)

(72) Inventors: Dries Dictus, Kessel-Lo (BE); Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 15 days.

(21) Appl. No.: 13/954,801

(22) Filed: Jul. 30, 2013

(65) Prior Publication Data

US 2015/0037973 A1 Feb. 5, 2015

(51) Int. Cl.
*H01L 21/00* (2006.01)
*H01L 21/768* (2006.01)

(52) U.S. Cl.
CPC ................. *H01L 21/76895* (2013.01)

(58) Field of Classification Search
None
See application file for complete search history.

(56) References Cited

U.S. PATENT DOCUMENTS

| 7,371,332 | B2 | 5/2008 | Larson et al. | |
|---|---|---|---|---|
| 7,825,516 | B2 * | 11/2010 | Chiras et al. | 257/774 |
| 7,998,864 | B2 | 8/2011 | Yang et al. | |
| 8,313,611 | B2 | 11/2012 | Larson | |
| 8,586,473 | B1 * | 11/2013 | Tanwar et al. | 438/652 |
| 2005/0001325 | A1 * | 1/2005 | Andricacos et al. | 257/762 |
| 2005/0085031 | A1 | 4/2005 | Lopatin et al. | |
| 2006/0234497 | A1 * | 10/2006 | Yang et al. | 438/638 |
| 2008/0160750 | A1 * | 7/2008 | Takewaki et al. | 438/598 |
| 2009/0108466 | A1 * | 4/2009 | Richter et al. | 257/776 |
| 2009/0152723 | A1 * | 6/2009 | Ou et al. | 257/751 |
| 2009/0152736 | A1 * | 6/2009 | Watanabe et al. | 257/774 |
| 2010/0041238 | A1 | 2/2010 | Cooperberg et al. | |
| 2010/0323516 | A1 * | 12/2010 | Ishikawa | 438/653 |
| 2011/0021024 | A1 * | 1/2011 | Calvo-Munoz et al. | 438/687 |
| 2013/0270703 | A1 * | 10/2013 | Zierath et al. | 257/751 |
| 2014/0030886 | A1 * | 1/2014 | Fukushima et al. | 438/653 |
| 2014/0045329 | A1 * | 2/2014 | Ishizaka et al. | 438/643 |
| 2014/0138837 | A1 * | 5/2014 | Niu et al. | 257/773 |
| 2014/0145332 | A1 * | 5/2014 | Ryan et al. | 257/751 |
| 2014/0161992 | A1 * | 6/2014 | Ishizaka et al. | 427/576 |
| 2014/0175046 | A1 * | 6/2014 | Ishizaka et al. | 216/18 |
| 2014/0264864 | A1 * | 9/2014 | Weng et al. | 257/751 |
| 2015/0004784 | A1 * | 1/2015 | Yokoyama et al. | 438/653 |

* cited by examiner

*Primary Examiner* — Charles Garber
*Assistant Examiner* — Evren Seven
(74) *Attorney, Agent, or Firm* — Beyer Law Group LLP

(57) ABSTRACT

A method of forming a capping layer over copper containing contacts in a dielectric layer with a liner comprising a noble metal liner around the copper containing contacts is provided. An electroless deposition is provided to deposit a deposition comprising copper on the noble metal liner and the copper containing contacts. A capping layer is formed over the deposition comprising copper.

15 Claims, 4 Drawing Sheets

METHOD FOR CAPPING COPPER INTERCONNECT LINES

BACKGROUND OF THE INVENTION

Field of the Invention

The invention relates to a method of forming semiconductor devices on a semiconductor wafer. More specifically, the invention relates to forming metal interconnects in low-k dielectric layers.

In forming semiconductor devices, conductive metal interconnects are placed in low-k dielectric layers. This may be done by depositing copper or a copper alloy into features etched into the low-k dielectric layer. The deposited copper may be deposited by electrodeposition or by electroless deposition. Electromigration of copper increases the failure rate of such interconnects. As feature size decreases, electromigration becomes a more significant problem.

SUMMARY OF THE INVENTION

To achieve the foregoing and in accordance with the purpose of the present invention, a method of forming a capping layer over copper containing contacts in a dielectric layer with a liner comprising a noble metal liner around the copper containing contacts, wherein the noble metal liner comprises at least one of Ru, Pd, Pt, Rh, Au, and Ag is provided. Electroless deposition is used to deposit a deposition comprising copper on the noble metal liner and the copper containing contacts. Electroless deposition is used to deposit a capping layer over the deposition comprising copper, wherein the capping layer comprises at least one of Co, or Ni.

In another manifestation of the invention, a method of forming a capping layer over copper containing contacts in a dielectric layer with a liner comprising a noble metal liner around the copper containing contacts is provided. An electroless deposition is provided to deposit a deposition comprising copper on the noble metal liner and the copper containing contacts. A capping layer is formed over the deposition comprising copper.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Copper contacts are prone to electromigration. Electromigration may cause the circuits made from the copper contacts to fail. With the reduction of size of the copper contacts, failure due to electromigration increases. Capping layers; which include: dielectric capping layers such as SiCN, and 'metallic' capping layers such as CoWP, are placed on copper contacts to reduce electromigration. Some of the copper contacts have liners comprising a noble metal. Such liners may interfere with the formation of caps. An embodiment of the invention allows the formation of caps in the presence of liners with noble metals.

Figure 1:
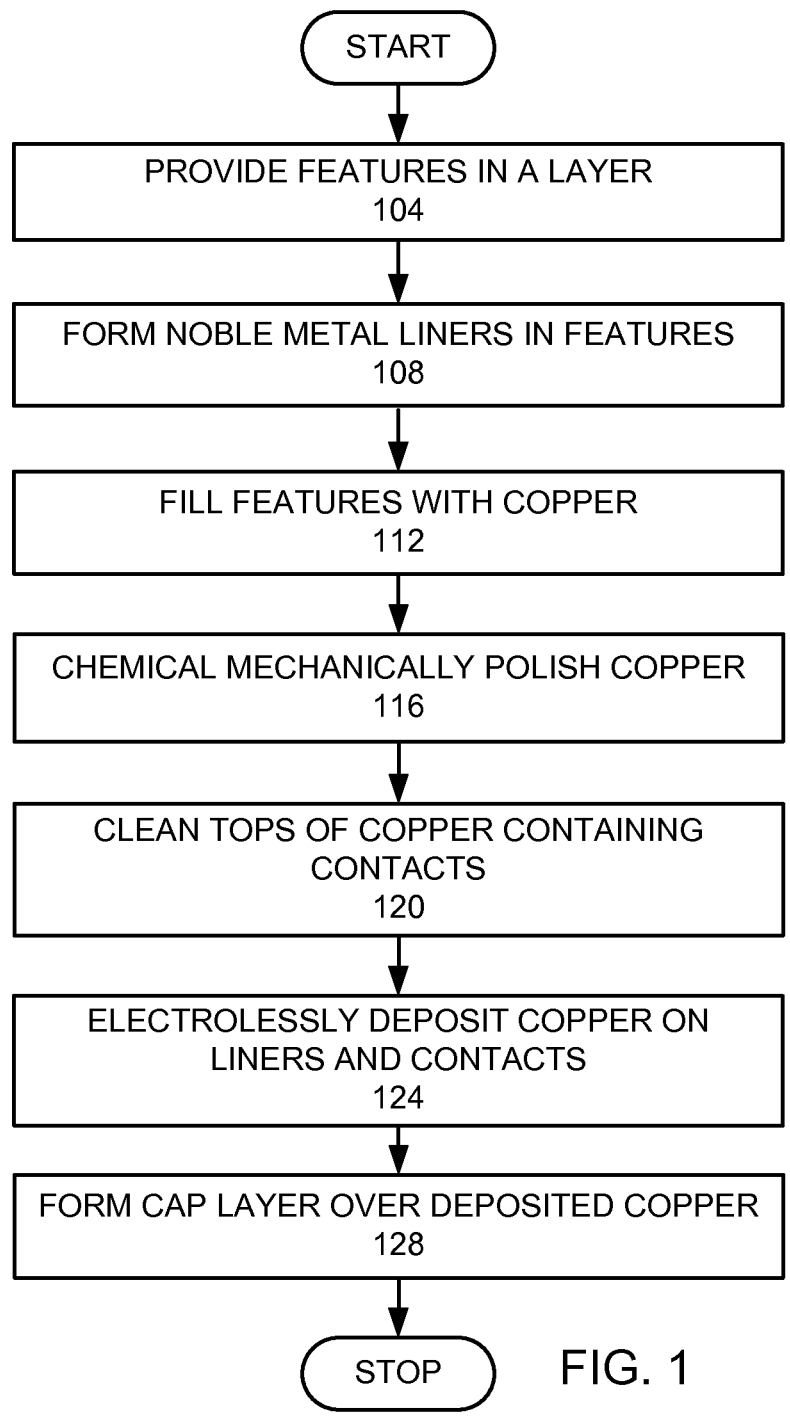
FIG. 1 is a flow chart of an embodiment of the invention.

FIG. 1 is a high level flow chart of an embodiment of the invention. In this embodiment, features are provided in a layer (step 104). Noble metal containing layers are formed in the features (step 108). The features are filled with copper to form copper containing contacts (step 112). Chemical mechanical polishing (CMP) is used to polish the copper back to the tops of the filled features (step 116). The tops of the copper containing contacts are cleaned (step 120). This removes any copper oxide on tops of the copper containing contacts. Copper is electrolessly deposited on the liners and copper containing contacts (step 124). Caps are formed over the deposited copper (step 128).

First Example

Figure 2A:
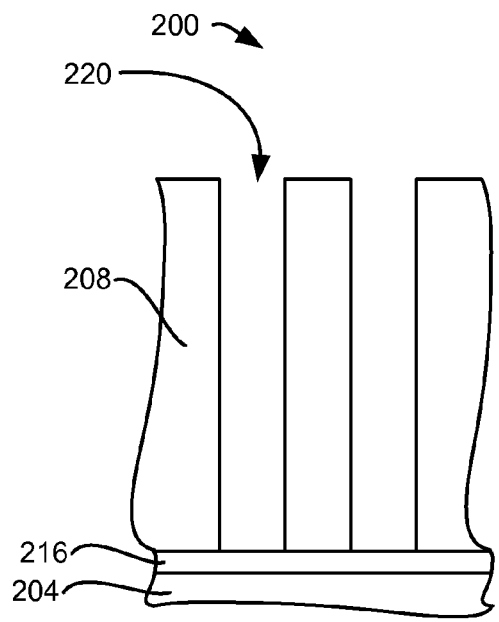
FIGS. 2A-F are schematic views of the formation of structures using an embodiment of the invention.

In a preferred embodiment of the invention, features are provided in a layer (step 104). FIG. 2A is a schematic cross-sectional view of a stack 200 with a substrate 204 with a layer 208 with features 220. In this example, one or more layers 216 are disposed between the substrate 204 and the layer 208. In this example the layer 208 with features 220 is a dielectric layer. More preferably, the layer 208 is a low-k dielectric layer, with a k value of less than 4.0. In this embodiment, the layer 208 is organosilicate glass (OSG). The features may be formed by etching the layer 208.

Figure 2B:
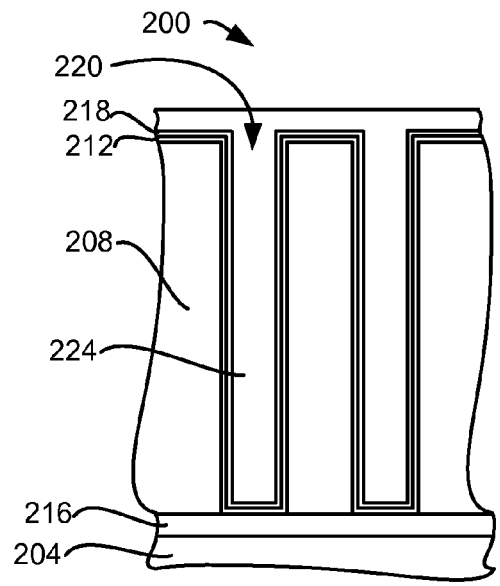

In this embodiment, a barrier layer 212 is formed in the features, as shown in FIG. 2B. In this example the barrier layer is titanium nitride (TiN). Noble metal containing liners 218 are formed in the features 220 (step 108). In this example, the noble metal containing liners 218 are formed from ruthenium (Ru).

The features 220 are filled with copper to form copper containing contacts 224 (step 112). The copper containing contacts may be pure copper or a copper alloy. Other steps may be provided in other embodiments to form or shape other layers.

Figure 2C:
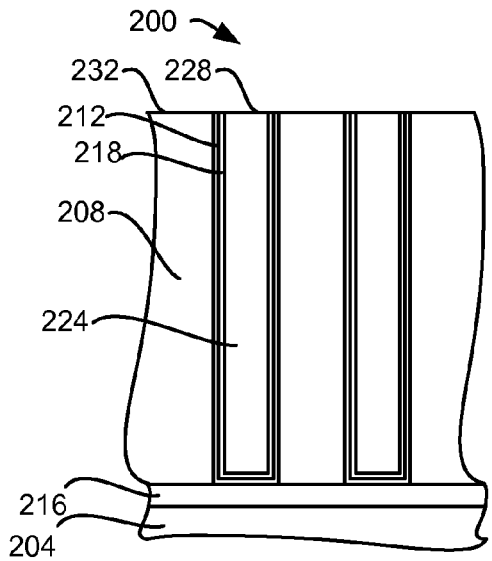

Chemical mechanical polishing is used to polish the copper containing contacts 224 back to the tops of the features, removing excess deposited copper outside of the features (step 116). FIG. 2C is a schematic cross-sectional view of the stack 200 after the excess copper outside of the features has been removed. In this embodiment, the tops 228 of the copper containing contacts 224 are even with the tops 232 of the layer 208 of the stack 200. In other embodiments, the tops 228 of the copper containing contacts 224 are below the tops 232 of the layer 208 of the stack 200. In other embodiments, other methods may be used to remove excess copper over the stack 200 and expose tops 228 of the copper containing contacts 224.

Figure 2D:
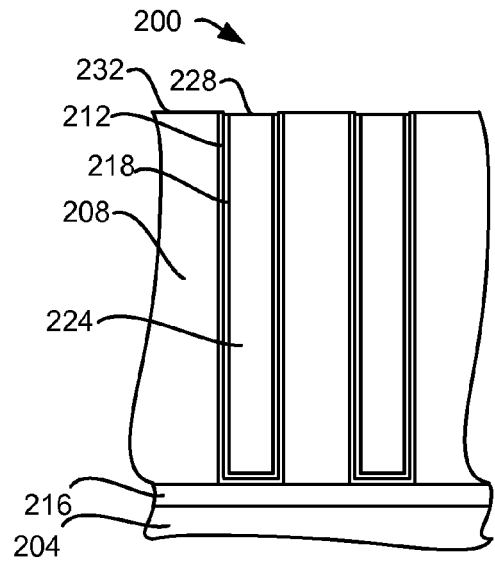

The tops of the copper containing contacts are cleaned to remove copper oxide from the tops of the copper containing contacts (step 120). In this embodiment, an acid bath is used to clean the tops of the copper containing contacts, which removes copper oxide. In this embodiment, the acid bath may be an organic acid such as citric acid or oxalic acid. FIG. 2D is a schematic cross-sectional view of the stack 200 after the tops 228 of the copper containing contacts 224 are cleaned. In this embodiment, the tops 228 of the copper containing contacts 224 are about even with the tops 232 of the layer 208 of the stack 200. In other embodiments, the acid bath may also remove excess copper on tops 228 of the copper containing contacts 224 so that the tops 228 of the copper containing contacts 224 are significantly lower than the tops 232 of the layers 208.

Figure 2E:
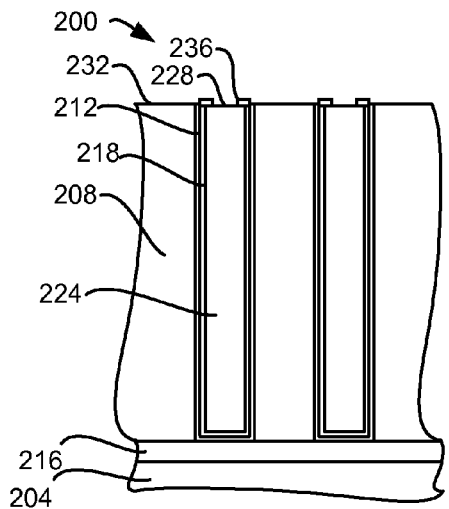

A copper containing deposition is selectively deposited on the tops 228 of the copper containing contacts 224 and the noble metal containing liner 218 with respect to the tops 232 of the layer 208 (step 124). In this embodiment, electroless deposition is used to provide the copper containing deposition. An example of an electroless deposition provides an electroless copper plating solution comprising an aqueous copper salt component, an aqueous cobalt salt component, a polyamine-based complexing agent, a chemical brightener component, and a pH-modifying substance. The copper containing contacts 224 and the noble metal containing liner 218 are placed in contact with the electroless copper plating solution. U.S. Pat. No. 7,297,190 by Dordi et al. issued on Nov. 20, 2007 provides examples of such processes. FIG. 2E is a schematic cross-sectional view of the stack 200 after forming the copper containing deposition 236 on tops 228 of the copper containing contacts 224 and the noble metal containing liner 218. The copper containing deposition 236 may be very thin, but is not drawn to scale, to provide a clear view of the copper containing deposition. The copper containing deposition 236 is mainly deposited over the noble metal containing liner 218 and part of the tops 228 of the copper containing contacts 224 that are adjacent to the noble metal containing liner 218. Since the noble metal containing liner 218 contains a noble metal, a galvanic couple is created between the noble metal containing liner 218 and the copper containing contacts 224. The galvanic coupling causes the an electroless deposition to deposit more on the noble metal containing liner 218 than on the copper containing contacts 224. Such a galvanic coupling may also dissolve some of the copper during the electroless deposition. If a different recipe is used to reduce the galvanic coupling, a layer of copper containing deposition 236 may be deposited over the entire exposed surface of the copper containing contacts 224. However, the galvanic coupling would still cause more copper containing deposition 236 to deposit over the noble metal containing liner 218.

Figure 2F:
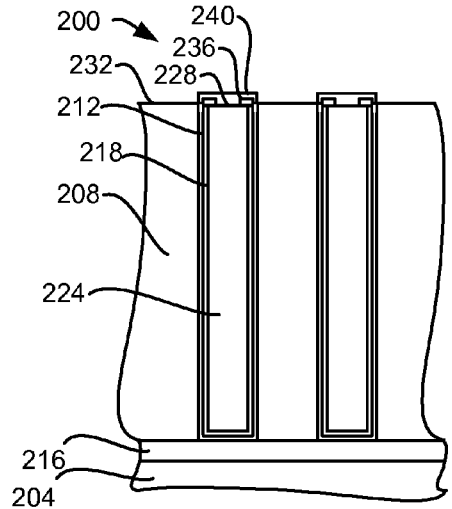

A capping layer is formed over the deposited copper containing deposition 236 and the copper containing contacts 224 (step 128). An example of such a deposition would provide a cobalt plating solution. The copper deposition 236 and copper containing contacts 224 are exposed to the cobalt plating solution. FIG. 2F is a schematic cross-sectional view of the stack 200 after the capping layer 240 is formed over the copper containing deposition 236 and the copper containing contacts 224. Although the capping layer 240 may be thin, the capping layer 240 is not drawn to scale to provide a clearer illustration.

Figure 3:
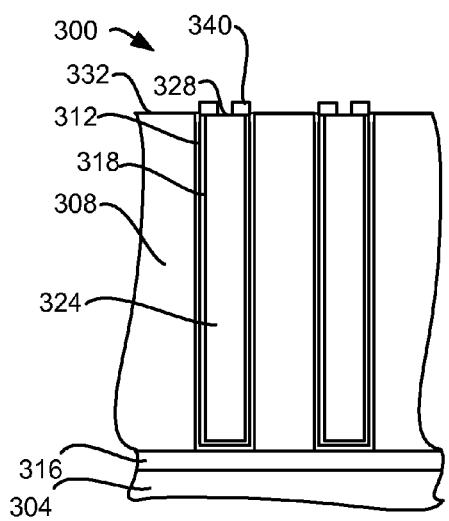
FIG. 3 is a schematic view of the formation of structures, where copper containing deposition is not provided.

This embodiment provides a capping layer 240 over the entire top 228 of the copper containing contacts 224 with a noble metal containing liner 218 to reduce electromigration. It has been found that without a copper containing deposition 236, a capping layer 240 may be formed that does not cover the entire top 228 of the copper containing contacts 224. FIG. 3 is a schematic cross-sectional view of a stack 300 that has been formed with a capping layer 340 over copper containing contacts 324 with a noble metal containing liner 318 and a barrier layer 312 in a dielectric layer 308 over a substrate 304 with an intermediate layer 316, where a copper containing deposition is not provided. Because the entire tops 328 of the copper containing contacts 324 are not covered by the capping layers 340, the copper containing contacts 324 are more susceptible to electromigration.

Second Example

Figure 4A:
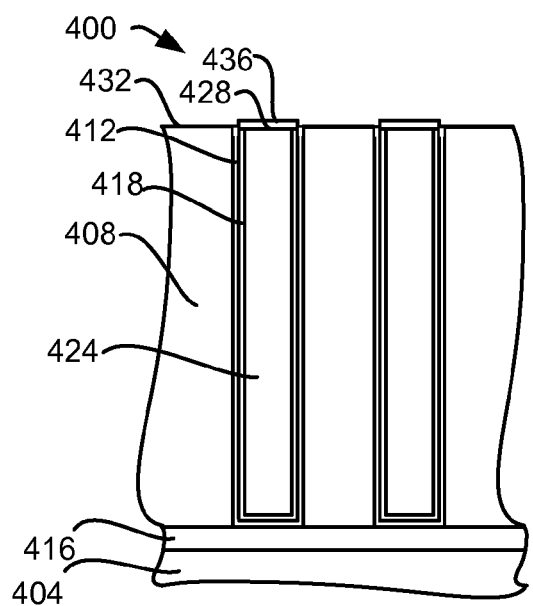
FIGS. 4A-B are schematic views of the formation of structures using another embodiment of the invention.

In another embodiment of the invention, steps 104 to 120 may be identical to the previous embodiment. In this embodiment, the recipe for electrolessly depositing the copper on the liners and the copper containing contacts (step 124) uses an electroless deposition to electrolessly deposit a copper alloy. Some examples of such copper alloys would be copper with nickel, indium, or tin. FIG. 4A is a schematic cross-sectional view of a stack 400 with a substrate 404 with a layer 408 with features. In this example, one or more layers 416 are disposed between the substrate 404 and the layer 408. In this example, the layer 408 is a dielectric layer. More preferably, the layer 408 is a low-k dielectric layer, with a k value of less than 4.0. As described above, a barrier layer 412 is inside the features, and a noble metal containing liner 418 lines the barrier layer 412. The features are filled with copper containing contacts 424. The electroless deposition selectively deposits the copper containing deposition 436 on tops the of the copper containing contacts 424 and the noble metal containing liner 418 with respect to the top 432 of the layer 408. In this embodiment, the copper containing deposition 436 is deposited on the entire top surfaces 428 of the copper containing contacts 424. More generally, the copper containing deposition is a copper alloy of at least one of an element of Ni, W, Mo, Re, Mn, Cr, V, Ru, Pt, Pd, Ag, In, Sn, Zn, B, or P.

Figure 4B:
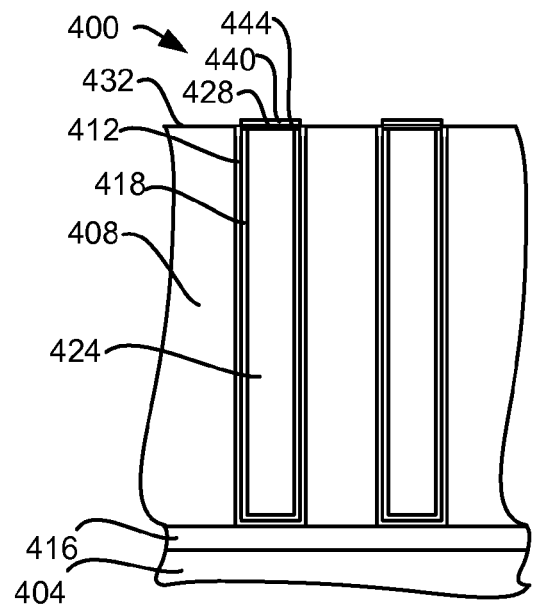

The capping layer is formed over the deposited copper (step 128). In this embodiment, the capping layer is formed by annealing the stack. The annealing provides an inert atmosphere such as vacuum, He, Ar or a reducing atmosphere such as $N_2$, $N_2/H_2$, or $NH_3$. A temperature is maintained between 25° C. and 450° C. for a time between 10 s and 1 hour. The exact conditions will depend largely on the chosen element. For example, Sn can diffuse at room temperature, while W, Mo, Re, and Mn may need higher temperatures for a longer time. Higher temperatures and longer times are better in general to allow migration of material which causes the copper containing deposition 436 to separate into various components, with at least one component rising to the top and forming the capping layer. Therefore, preferable the temperature is between 100° C. and 450° C. for a period between 30 minutes and 1 hour. FIG. 4B is a schematic cross-sectional view of a stack 400 after the stack has been annealed causing the copper containing deposition to separate to form a capping layer 440 and a copper containing layer 444. As shown, the capping layer 440 is over the entire copper containing contacts 424. In this embodiment, the capping layer 440 comprises nickel, indium, or tin.

The transfer time from the CMP tool to the next processing tool may provide sufficient wait time of up to 24 hours to form a copper oxide layer on tops of the copper deposit. The cleaning of the tops of the copper deposit removes copper oxide, which reduces line resistance.

In addition, the use of electroless deposition for the selective copper alloy plating eliminates overhang, which reduces problems with scaling to small feature sizes. In addition, the electroless deposition provides a high selectivity to reduce or eliminate deposition on the tops of the dielectric layer while depositing on top of the copper deposit. The use of electroless deposition also allows for a short time between the acid bath for cleaning and the bath for electroless deposition, since these processes may be done in the same chamber. Such a short time reduces the formation of copper oxide after cleaning. Depending on the alloy component, the cap may reduce the formation of copper oxide.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of forming a capping layer over copper containing contacts in a dielectric layer with a liner comprising a noble metal liner around the copper containing contacts, comprising:
    using electroless deposition to deposit a deposition comprising copper on the noble metal liner and the copper containing contacts, such that the deposition covers the noble metal liner, covers a first portion of the copper containing contact adjacent to the noble metal liner, and does not cover at least a second portion of the copper containing contact, wherein the thickness of the deposition comprising copper over the noble metal liner is thicker than the deposition comprising copper over the first portion of the copper containing contact; and
    forming a capping layer over the deposition comprising copper.

2. The method, as recited in claim 1, wherein the noble metal liner comprises at least one of Ru, Pd, Pt, Rh, Au, and Ag.

3. The method, as recited in claim 2, wherein the capping layer comprises at least one of W, Mo, Re, Mn, Cr, V, Ru, Pt, Pd, Ag, In, Sn, Zn, B, P, Co, or Ni.

4. The method, as recited in claim 3, wherein the forming the capping layer is by electrolessly depositing a capping layer over the deposition comprising copper.

5. The method, as recited in claim 4, wherein the electroless depositing a capping layer deposits an alloy comprising Co or Ni.

6. The method, as recited in claim 5, further comprising providing an acid bath to the copper containing contacts before using electroless deposition to deposit a deposition comprising copper.

7. The method, as recited in claim 6, wherein the using electroless deposition to deposit a deposition comprising copper is in an oxygen free environment.

8. The method, as recited in claim 6, further comprising chemically mechanically polishing the copper containing contacts before providing the acid bath.

9. The method, as recited in claim 4, wherein the electroless deposition creates a galvanic couple between the noble metal liner and the copper containing contacts, such that the thickness of the deposition comprising copper is greater over the noble metal liner than over the copper containing contact.

10. The method, as recited in claim 3, wherein the forming the capping layer comprises annealing the deposition comprising copper to cause the deposition comprising copper to separate forming a capping layer on top of the deposition comprising copper.

11. The method, as recited in claim 1, wherein the capping layer comprises at least one of W, Mo, Re, Mn, Cr, V, Ru, Pt, Pd, Ag, In, Sn, Zn, B, P, Co, or Ni.

12. The method, as recited in claim 1, wherein the forming the capping layer is by electrolessly depositing a capping layer over the deposition comprising copper.

13. The method, as recited in claim 12, wherein the electroless depositing a capping layer deposits an alloy comprising Co or Ni.

14. The method, as recited in claim 1, wherein a barrier layer not comprising a noble metal is sandwiched between the noble metal liner and the dielectric layer, and wherein the deposition comprising copper covers the noble metal liner adjacent to the barrier layer, and does not extend to cover the entirety of the barrier layer.

15. The method, as recited in claim 2, wherein the noble metal liner consists essentially of one of Ru, Pd, Pt, Rh, Au, and Ag.

* * * * *